United States Patent
Yamasaki et al.

(10) Patent No.: US 8,088,713 B2
(45) Date of Patent: Jan. 3, 2012

(54) SUPERCONDUCTING FAULT-CURRENT LIMITING ELEMENT AND THE PROCESS FOR PRODUCING THE SAME

(75) Inventors: Hirofumi Yamasaki, Ibaraki (JP); Mitsuho Furuse, Ibaraki (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 720 days.

(21) Appl. No.: 11/630,478

(22) PCT Filed: Jun. 17, 2005

(86) PCT No.: PCT/JP2005/011117
§ 371 (c)(1),
(2), (4) Date: Dec. 22, 2006

(87) PCT Pub. No.: WO2006/001226
PCT Pub. Date: Jan. 5, 2006

(65) Prior Publication Data
US 2008/0026946 A1    Jan. 31, 2008

(30) Foreign Application Priority Data
Jun. 24, 2004  (JP) .............................. P. 2004-186966

(51) Int. Cl.
*H01L 39/16*  (2006.01)
*H02H 9/02*  (2006.01)

(52) U.S. Cl. ......... 505/236; 505/191; 427/62; 361/93.9; 420/507; 420/511; 420/901

(58) Field of Classification Search ............... 505/191; 427/62; 361/93.9; 420/507, 511, 901; *H01L 39/16*; *H02H 9/02*; *C30B 29/22*
See application file for complete search history.

(56) References Cited

U.S. PATENT DOCUMENTS

| 5,361,055 | A | * | 11/1994 | Peck ........................... 335/216 |
| 5,430,012 | A | * | 7/1995 | Nakamura et al. ............ 505/234 |
| 5,969,928 | A | * | 10/1999 | Hashimoto et al. ........... 361/106 |
| 6,051,846 | A | * | 4/2000 | Burns et al. ..................... 257/35 |
| 6,522,236 | B1 | * | 2/2003 | Ries .................................. 338/13 |
| 6,524,684 | B1 | * | 2/2003 | Heismann ...................... 428/209 |

FOREIGN PATENT DOCUMENTS

| CA | 2083566 | * | 5/1994 |
| DE | 199 63 181 C2 | | 7/2001 |

(Continued)

OTHER PUBLICATIONS

Machine translation Okuda (JP08-083932).*

(Continued)

*Primary Examiner* — Melvin Mayes
*Assistant Examiner* — Jun Li
(74) *Attorney, Agent, or Firm* — Morgan, Lewis & Bockius LLP

(57) ABSTRACT

To prepare a superconducting fault-current limiting element having a high sharing electric field at low cost, a superconducting fault-current limiting element includes an insulator substrate; a superconductive thin film formed on the insulator substrate; and an alloy layer formed on the superconducting thin film, said alloy layer having a room-temperature resistivity higher by twice or more than the room-temperature resistivity of a pure metal, in which, when the superconducting thin film goes into a normal conductive state by an overcurrent, the overcurrent flowing through the superconducting thin film is transferred only to the alloy layer.

8 Claims, 3 Drawing Sheets

FOREIGN PATENT DOCUMENTS

| | | |
|---|---|---|
| EP | 0 828 333 A2 | 3/1998 |
| JP | 5-251761 | 9/1993 |
| JP | 8-83932 | 3/1996 |
| JP | 2954124 B | 7/1999 |
| JP | 2002-198577 | 7/2002 |
| JP | 2003-153437 | 5/2003 |

OTHER PUBLICATIONS

Machine translation of Shimohata (JP2002-198577).*

A. Heinrich et al., "Fault Current Limiting Properties of YBCO-Films on Sapphire Substrates," *IEEE Transactions on Applied Superconductivity*, vol. 9, No. 2, Jun. 1999, pp. 660-663.

B. Gromoll et al., "Resistive Fault Current Limiters with YBCO Films—100 kVA Functional Model," *IEEE Transactions on Applied Superconductivity*, vol. 9, No. 2, Jun. 1999, pp. 656-659.

H. Kubota et al., "A New Model of Fault Current Limiter using YBCO Thin Film," *IEEE Transactions on Applied Superconductivity*, vol. 9, No. 2, Jun. 1999, pp. 1365-1368.

Hiroshi Kubota et al., "Design of a Fault Current Limiter using YBCO Thin Film," *Abstract of the 64th Meeting on Cryogenics and Superconductivity*, 2001, p. 166.

Hirofumi Yamasaki et al., "High-Power-Density Fault-Current Limiting Devices Using Superconducting $YBa_2Cu_3O_7$ Films and High-Resistivity Alloy Shunt Layers" *Applied Physics Letters*, vol. 85, No. 19, Nov. 8, 2004, pp. 4427-4429.

* cited by examiner

SUPERCONDUCTING FAULT-CURRENT LIMITING ELEMENT AND THE PROCESS FOR PRODUCING THE SAME

TECHNICAL FIELD

The present invention relates to a superconducting fault-current limiting element for limiting an overcurrent such as a short-circuiting current flowing through a current path and the process for producing the same.

BACKGROUND ART

Although a superconductor permits a large current to pass with no resistance in a superconductive state, when a current larger than a particular value (critical current) passes, it generates an electrical resistance. When the current is further increased, the temperature of the superconductor rises owing to generated heat so that the superconductor goes into a normal conductive state, thereby generating a large electrical resistance. By making the use of such a feature of the superconductor, a superconducting fault-current limiter has been employed which has no resistance during a normal operation condition and generates a large resistance in the short-circuiting accident of an electric power system, thereby suppressing an increase in the accident current.

A serious problem in promoting dereguration in power systems is an increase in the fault-current at the short-circuiting accident due to the connection of new distributed power sources. The most hopeful countermeasure therefor is introduction of a fault-current limiter which has a low impedance during normal operating conditions and develop a high impedance in a system accident, thereby suppressing the accident current. The introduction of the fault-current limiter provides merits of reduction in the specification of the accident current of the distributed power sources and also contributes to cost reduction of the distributed power sources and improvement of maintenance of facilities. From the point of view of promoting power dereguration, the social demand for realization of the fault-current limiter at low cost and with high reliability is very high. Assuming that the fault-current limiter is introduced in a power distributing system, a superconducting thin-film fault-current limiter employing a superconducting thin film having large area is excellent in various points such as being compact, instantaneously responding to an overcurrent, generating a small AC loss during the normal operating conditions, etc. and therefore, it is supposedly most excellent from the point of views of reliability, performance, volume and extension to a large capacity.

The superconducting thin film fault-current limiter has a thin film current-limiting element operating at a liquid nitrogen temperature (66 to 77.3K), connected in series with a power system. In this fault-current limiter, as the current in the short-circuiting accident increases, the thin film changes from the superconductive state (S) to the normal conductive state, so that the system current is suppressed by a normal resistance. This fault-current limiter is also called an SN transition-type resistive fault-current limiter. Conventionally, a superconducting thin film having large area has been employed in which the thin film of a high temperature superconducting oxide such as $YBa_2Cu_3O_7$ (hereinafter referred to as YBCO) is formed on an insulator substrate such as a sapphire substrate (single-crystal alumina substrate). However, since the superconducting thin film is expensive, it has been demanded to decrease the area of the superconducting thin film employed as the fault-current limiting element to the utmost, thereby reducing the cost.

The superconducting thin-film fault-current limiting element limits the current by generating a resistive voltage V in an accident. In this case, when the voltage which can be generated (applied) for the unit length of the thin-film current-limiting element (sharing electric field) is high, the length of the element can be correspondingly shortened, whereby the area required for the superconducting thin film can be reduced. However, since the quantity of heat generated by the thin-film current-limiting element during the current-limiting operation can be expressed as $P=V^2/R$, increase in the sharing electric field leads to an increase in the quantity of generated heat. The thin-film current-limiting element is generally designed so that the temperature of the superconducting thin film does not exceed room temperature for a rated fault duration (e.g. 0.1 sec). Therefore, in order to improve the sharing electric field, it is necessary to suppress the increase in the quantity of generated heat of the superconducting thin film during the current-limiting operation, or suppress a temperature rise by increasing the heat capacity of the superconducting thin film. However, the latter increases the volume of the expensive insulating substrate and so will lead to cost increase. Thus, in order to improve the sharing electric field, it is desirable to suppress the increase in the quantity of generated heat by increasing the resistance R when the superconductive path goes into a normal conductive state.

The resistance of the superconductive path can be increased by connecting only superconducting thin films in series or in parallel. When the large-area superconducting thin-film employed for the fault-current limiting element is very uniform and the transition to the normal conductive state is done nearly simultaneously over the entire area, such a configuration can be realized. There is a report of the experiment in a laboratory using the thin film with a low critical current density (see Non-Patent Reference 1). However, in actual use, since the thin film with a high critical current density is adopted, there is the problem of a "hot spot" as described in the following paragraph. In order to overcome such a problem, a shunting resistor must be connected in parallel with the superconducting film as shown in FIG. 5.

The superconducting thin film has variation in the local critical current density. Therefore, at the initial time of current-limiting immediately after the accident, the region with the low critical current density first goes into the normal conductive state but the entire region does not go into the normal state. As a result, a large current continues to flow. In the case that the diffusion of heat generated at the region that has become the normal state is slow, the temperature of this region will locally abruptly rise so that the thin film is burned. A conventional measure for preventing such a hot spot phenomenon is to deposit a normal conductive metal such as gold or silver on the superconducting thin film, which is used as a shunting layer at the time of transition to the normal state (protective layer for preventing burning) (see Non-Patent Reference 2). However, addition of such metallic shunting layer greatly reduces the electrical resistance of the superconductive path and increases the heat generation during the current-limiting operation. For this reason, the sharing electric field must be reduced. As a result, in order to acquire the required current-limiting capacity, the element length must be increased and a large quantity of the expensive superconducting thin film must be employed. This is a serious obstacle to actual use.

In order to reduce the area of the superconducting thin film to be employed to the utmost, there is proposed a technique in which the metallic shunting layer is not deposited on the superconducting thin film but a metallic thin-film shunting layer is formed on another ceramic substrate having a high thermal conductivity and connected to the superconducting thin film through an indium plate (see Patent Reference 1, Non-Patent Reference 3 and Non-Patent Reference 4). In this technique, the heat generated during the current-limiting operation is absorbed by the ceramic substrate different from the superconducting thin film. Therefore, by increasing its heat capacity, the temperature rise in the element can be suppressed and accordingly, the sharing electric field of the element can be increased. For example, the area of the superconducting thin film formed on a sapphire substrate necessary for the current-limiting element in a class of 6.6 kV/2 kA can be reduced to about 1/30 of the conventional element. This supposedly leads to great cost reduction. However, according to this technique, it is necessary to use a large quantity of a highly thermal conductive ceramic substrate such as aluminum nitride and indium plate. Since these materials are expensive, there has been a limit in cost reduction.

Non-Patent Reference 1: A. Heinrich, R. Semerad, H. Kinder, H. Mosebach and M. Lindmayer, "Fault current limiting properties of YBCO-films on sapphire substrates", IEEE Trans. Appl. Supercond. 9 (1999) 660-663

Non-Patent Reference 2: B. Gromoll, G. Ries, W. Schmidt, H.-P. Kraemer, B. Seebacher, B. Utz, R. Nies, H.-W. Neumueller, E. Baltzer, S. Fischer and B. Heismann, "Resistive fault current limiters with YBCO films-100 kVA functional model", IEEE Trans. Appl. Supercond. 9 (1999) 656-659

Non-Patent Reference 3: H. Kubota, Y. K. Arai, M. Yamazaki, H. Yoshino and H. Nagamura, "A new model of fault current limiter using YBCO thin film", IEEE Trans. Appl. Supercond. 9 (1999) 1365-1368

Non-Patent Reference 4: Kubota, Kudo, Yoshino, Wachi, "Design of a fault current limiter using YBCO thin film", Abstract of the 64$^{th}$ Meeting on Cryogenics and Superconductivity, (2001) 166

Patent Reference 1: Japanese Patent No. 2954124

DISCLOSURE OF THE INVENTION

Problems that the Invention is to Solve

In the conventional superconducting thin-film fault-current limiting element, in order to prevent the hot spot phenomenon at the time of initial current-limiting, a pure metal such as gold or silver deposited on the superconducting thin film is used as a shunting layer at the time of transition to the normal state. However, the resistivity of the pure metal is lower by about two orders of magnitude than that of superconducting oxide, so that the resistance of the superconductive path is greatly reduced. Thus, during the current-limiting operation, the quantity of generated heat is increased, so that the sharing electric field of the superconductive thin-film current-limiting element is greatly reduced. As a result, the required quantity of the expensive superconducting thin film is increased. This is very disadvantageous in cost. If the pure metal can be deposited very thin (with a film thickness of the order of nanometer) and uniformly on the superconducting thin film, the problem of reduction in the electric resistance can be solved. However, it is not clear whether or not such a deposition technique can be realized. Even if it can be realized, it is not clear where it leads to the solution of the problem of the hot spot.

An object of the present invention is to solve the problem of the hot spot of a superconducting thin film without greatly reducing the resistance of a superconductive path by depositing an alloy layer having resistivity much higher than a pure metal on the superconducting thin film, and also to provide a superconducting fault-current limiting element capable of attaining a higher sharing electric field by connecting an external noninductively wound shunt resistor made of a pure metal or alloy wire in parallel with the superconducting thin film on which the alloy layer is formed so that the resistance of the superconductive path is increased, and the process for producing the same.

Means for Solving the Problems

In order to solve the above problems, the present invention adopts the following measures.

The first measure is a superconducting fault-current limiting element including an insulator substrate; a superconducting thin film formed on the insulator substrate; and an alloy layer formed on the superconducting thin film, said alloy layer having a room-temperature resistivity higher by twice or more than the room-temperature resistivity of a pure metal, in which, when the superconducting thin film goes into a normal conductive state by an overcurrent, the overcurrent flowing through the superconducting thin film is transferred only to the alloy layer.

The second measure is the superconducting fault-current limiting element according to the first measure, in which the alloy layer includes a binary alloy layer of gold and silver or a multinary alloy layer of gold, silver and other element(s).

The third measure is a superconducting fault-current limiting element including an insulator substrate; a superconducting thin film formed on the insulator substrate; and an alloy layer formed on the superconducting thin film, said alloy layer having a room-temperature resistivity higher by twice or more than the room-temperature resistivity of a pure metal, in which the superconducting fault-current limiting element further includes a shunt resistor made of a wire of a pure metal or alloy, and the shunt resistor is connected in parallel with the superconducting thin film.

The fourth measure is a superconducting fault-current limiting element according to the third measure, in which the shunt resistor is made of a noninductively wound wire to thereby give a smaller inductance.

The fifth measure is a method for fabricating a superconducting fault-current limiting element according to the first measure or third measure, which includes conducting a sputter deposition of the alloy layer on the superconducting thin film formed on the insulator substrate.

Advantage of the Invention

In accordance with the inventions, the superconducting fault-current limiting element having a higher sharing electric field can be produced at low cost.

In accordance with the invention, since the resistance of the alloy layer can be increased, the superconducting fault-current limiting element having a higher sharing electric field can be realized.

In accordance with the invention, since the inductance of an external shunt resistor can be reduced, an overcurrent can be easily transferred to the shunt resistor.

In accordance with the invention, the alloy having substantially the same composition as that of a target can be easily formed. Good intimate contact with the superconducting thin film can be realized without conducting the subsequent heat treatment, so that a contact resistance between the alloy layer and the superconducting thin film can be reduced.

Figure 1:
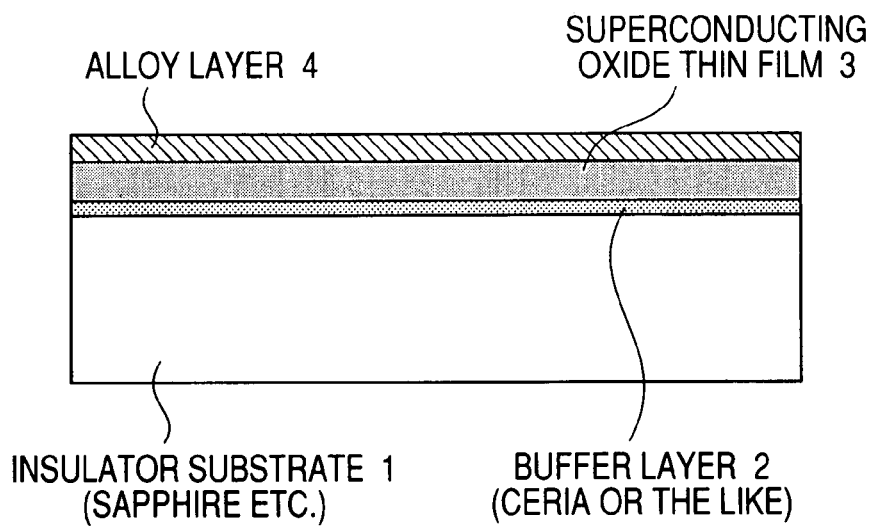
FIG. 1 is a view showing the construction of a superconducting thin-film fault-current limiting element according to one embodiment of the invention.

DESCRIPTION OF REFERENCE NUMERALS AND SIGNS 1 insulator substrate
2 buffer layer
3 superconducting oxide thin film
4 alloy layer
5 gold electrode
6 noninductively wound shunt resistor

BEST MODE FOR CARRYING OUT THE INVENTION

Referring to FIGS. 1 to 4, an explanation will be given with regard to one embodiment of the invention.

FIG. 1 is a view showing the construction of a superconducting thin-film fault-current limiting element.

In FIG. 1, reference numeral 1 denotes an insulator substrate of sapphire or the like; 2 denotes a buffer layer of ceria or the like; 3 denotes a large-area superconducting oxide thin film; and 4 denotes an alloy layer having a predetermined film thickness deposited on the superconducting oxide thin film 3.

The alloy layer 4 may be a binary alloy composed of gold and silver which is stable in the air and does not react with the superconducting oxide thin film 3. When the alloy layer 4 has the composition of gold and silver mixed by 7 to 82 wt % therewith, the resistivity thereof at room temperature is twice or more as large as that of pure gold. Therefore, the alloy layer having such a composition is favorable in construction of the superconducting thin-film fault-current limiting element. Particularly, the alloy having the composition in which 23 wt % of silver is mixed to gold, whose resistivity is maximum or about five times as large as pure gold, is supposedly optimum. Incidentally, in the vicinity of 100K, the resistivity of pure gold is reduced to about one third as large as that at room temperature whereas that of the alloy is not nearly reduced. It leads to a difference of about 15 times.

As a method for depositing the alloy layer 4 on the superconducting oxide thin film 3, various methods such as vacuum deposition and sputtering can be adopted. However, in the invention, sputtering is adopted. The most general vacuum deposition, in which an alloy constructed of metals having different melting points is deposited to have a desired composition, has disadvantages that it requires precise control of deposition of constituent metals and requires the subsequent heat treatment owing to poor contact between the deposited alloy film and the superconducting thin film. On the other hand, in the sputtering, the alloy having substantially the same composition as the target can be easily formed and the good contact with the superconducting oxide film can be obtained without the subsequent heat treatment. Thus, the contact resistance can be reduced so that the resultant structure can be employed as the fault-current limiting element as it is.

In addition, in the above embodiment, the binary alloy composed of gold and silver is employed as the alloy layer 4. However, without being limited to such an alloy, even when a multinary alloy in which other element is added to gold and silver, such as a commercially available 18-carat gold (composed of gold of 75 wt %, silver of 12.5 wt % and copper of 12.5 wt %) is employed, same effect can be obtained.

Figure 2:
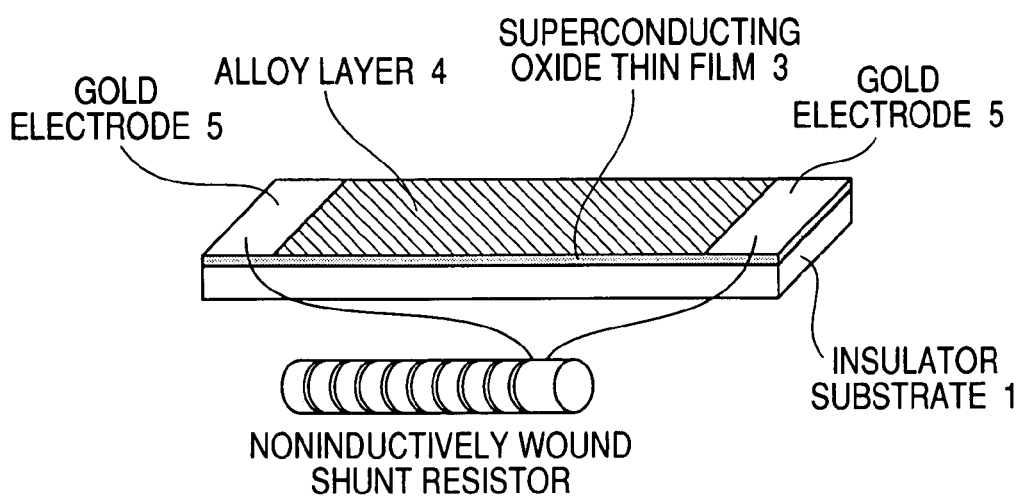
FIG. 2 is a view showing the construction of a superconducting thin-film fault-current limiting element according to one embodiment of the invention, in which an external noninductively wound shunt resistor made of a pure metal or alloy wire is connected in parallel with the superconducting thin film.

FIG. 2 is a view showing the construction of a superconducting thin-film fault-current limiting element in which an external noninductively wound shunt resistor 6 made of a pure metal or alloy wire is connected in parallel with the superconducting oxide thin film 3 in order to realize a higher sharing electric field. The above shunt resistor 6 has a resistance much smaller than the composite resistance of the superconducting oxide thin film 3 after the transition to the normal conductive state and the alloy layer 4.

In FIG. 2, reference numeral 5 denotes gold electrodes deposited on both ends of the superconducting oxide thin film 3. Other reference numerals refer to like parts in FIG. 1.

The function of the noninductively wound shunt resistor 6 is to further alleviate the problem of hot spot in the superconducting oxide thin film 3 in such a manner that the transfer of an overcurrent at the time of transition to the normal state (initial time of current-limiting) is shared by not only the alloy layer 4 but also by the non-inductive shunting resistor 6, thereby further increasing the resistance of the superconducting thin-film fault-current limiting element. In order to facilitate the transfer of the overcurrent, it is desirable that the inductance of the external noninductively wound shunt resistor 6 is as small as possible. For this reason, the shunt resistor was made of a noninductive winding of a cheap alloy wire.

Further, usually, the sharing electric field of the superconducting thin-film fault-current limiting element must be determined so that the temperature of the current-limiting element does not rise to room temperature or higher during the current-limiting operation. In attaching the external noninductively wound shunt resistor 6 having a small resistance, considerable heat is generated at this area. However, the temperature rise can be suppressed by using the noninductively wound shunt resistor having a sufficiently large heat capacity. Therefore, the heat generated in the noninductively wound shunt resistor 6 will not cause to reduce the sharing electric field of the body of the superconducting thin-film current-limiting element.

Next, a description will be given for the result of current-limiting test of the superconducting thin-film fault-current limiting element according to the above embodiment. First, in the superconducting thin-film fault-current limiting element employed in this current-limiting test, as the superconducting oxide thin film, a YBCO thin film (DC critical current of 45 A) having a thickness of 300 nm and a critical current density of 3 $MA/cm^2$ is formed on a sapphire substrate having a size of 5 mm×60 mm×1 mm. In the areas of 10 mm at both ends on the superconducting thin film, gold is deposited to provide electrodes. In the area of 40 mm at the center on the superconducting thin film, using the target of the alloy having the composition in which silver is mixed by 23 wt % with gold, an Au—Ag alloy layer having a film thickness of about 100 nm is deposited by sputtering. By depositing the Au—Ag alloy layer, the resistance of the superconducting thin-film fault-current limiting element at room temperature was reduced to about 1/7 as compared with the case where only the YBCO layer is used (about 60Ω).

Figure 3:
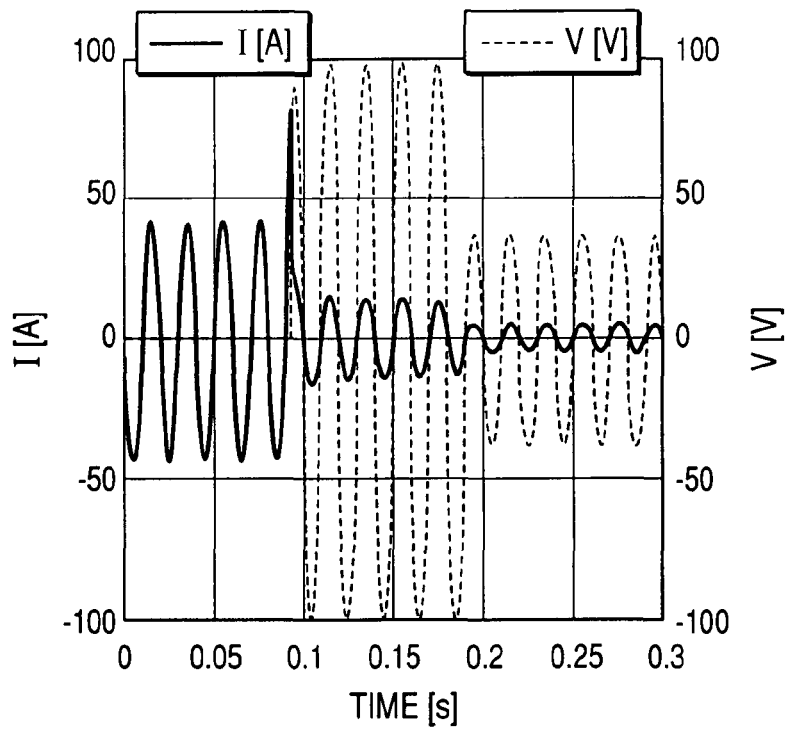
FIG. 3 is a graph showing the result of a current-limiting test of a superconducting thin-film fault-current limiting element according to one embodiment of the invention.

FIG. 3 is a graph showing the result of the current-limiting test using the above superconducting fault-current limiting element.

As shown in FIG. 3, in order to simulate the short-circuiting accident in an electric power system, a high voltage was applied for a moment in the state where a current of about 40 $A_{peak}$ flows through the superconducting thin-film fault-current limiting element with the alloy layer 4 deposited thereon. An overcurrent of about 80 $A_{peak}$ instantaneously flowed through the superconducting thin-film fault-current limiting element. The superconducting oxide thin film 3 went into the normal conductive state without being burned, so that the overcurrent having been flowed through the superconducting oxide thin film 3 was transferred to the alloy layer 4. Thus, the overcurrent was instantaneously limited. In this way, it was clarified that at the initial time of current-limiting, by adding the shunting protective layer of the Ag—Au alloy having a resistance about half of that of the YBCO thin film, the problem of the hot spot in the superconducting oxide thin film 3 can be solved. With a voltage of about 100 $V_{peak}$ being applied to the superconducting thin film fault-current limiting element according to this embodiment, current passing can be executed over five cycles (0.1 sec) without burning of the superconducting oxide thin film 3. Thus, it was verified that the superconducting thin-film fault-current limiting element having a high sharing electric field of 25 $V_{peak}$/cm or more can be prepared.

Next, by sputter-depositing the Au—Ag alloy layer having a film thickness of about 50 nm on the superconducting oxide thin film 3 similar to the YBCO thin film employed for the superconducting thin film current-limiting element in the current-limiting test of FIG. 3, a superconducting thin film with the alloy shunting layer, having a higher room-temperature resistance (about 15Ω) was prepared. Further, to both ends thereof, an external noninductively wound shunt resistor 6 (about 2.8Ω) made of a Manganin (alloy of copper and manganese) wire of noninductive winding is connected.

Figure 4:
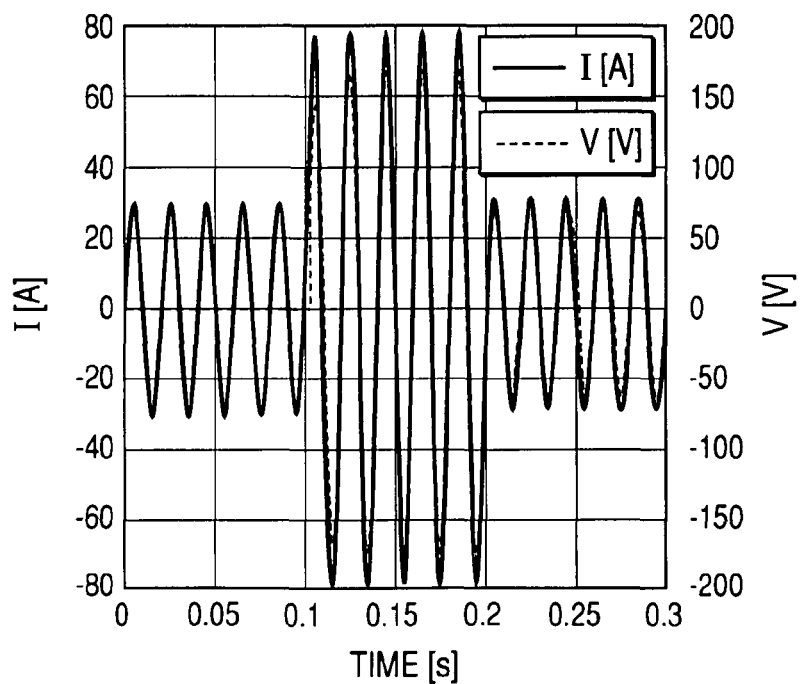
FIG. 4 is a graph showing the result of a current-limiting test of a superconducting thin-film fault-current limiting element according to one embodiment of the invention, to which a noninductively wound shunt resistor is connected.
Figure 5:
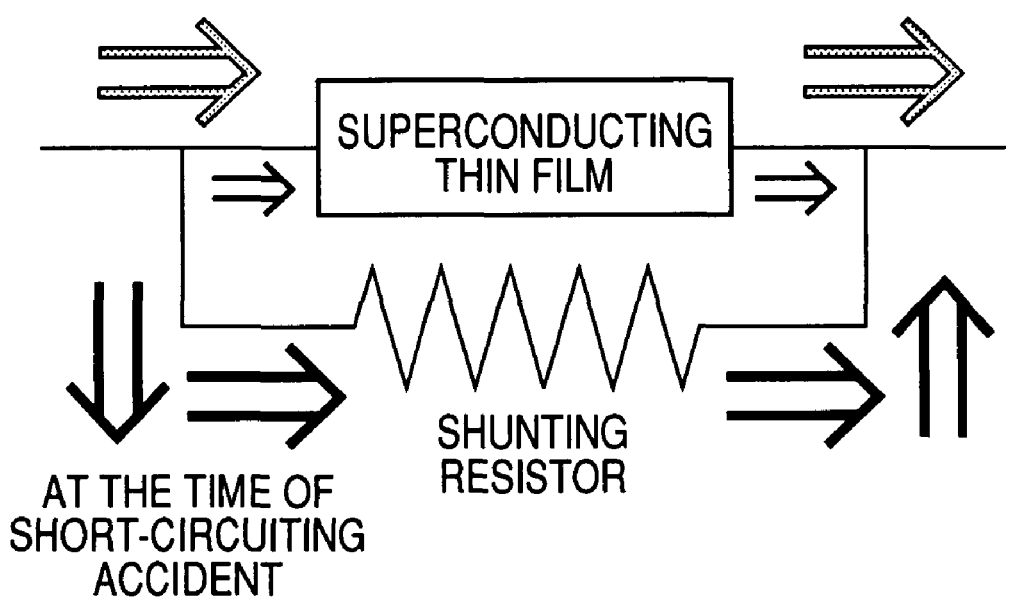
FIG. 5 is a view showing the construction of a conventional superconducting fault-current limiting element in which a shunting resistor is connected to a superconducting thin film.

FIG. 4 is a graph showing the result of a current-limiting test using the above superconducting thin-film fault-current limiting element.

As shown in FIG. 4, when the AC passing current is instantaneously increased from about 30 $A_{peak}$ to about 80 $A_{peak}$, the superconducting oxide thin film 3 went into the normal conductive state without being burned, so that the overcurrent having flowed through the superconducting oxide thin film 3 was transferred to the alloy layer 4 and the noninductively wound shunt resistor 6. During the current-limiting operation, an AC voltage of about 176 $V_{peak}$ was being applied to both ends of the superconducting thin-film fault-current limiting element, and current passing could be carried out over five cycles (0.1 sec) without the burning of the thin film. Thus, it was verified that the superconducting thin-film fault-current limiting element having a high sharing electric field of 44 $V_{peak}$/cm or more can be prepared.

For comparison, the superconducting fault-current limiting element of the YBCO thin film which does not have the shunting protective layer such as the alloy layer was prepared. With the external shunt resistor being connected in parallel, the same current-limiting test was carried out. In this test, when the AC passing current is instantaneously increased to about 30 $A_{peak}$ to about 60 $A_{peak}$, a part of the thin film was burned during the current passing during one cycle, which resulted in an insulating state. Thus, it was confirmed that the thin film having such a high critical current density cannot realize the current-limiting operation without the measure for obviating the hot spot.

The invention claimed is:

1. A superconducting fault-current limiting element comprising:
    a sapphire substrate;
    a buffer layer;
    a superconducting thin film; and
    an alloy layer formed on the superconducting thin film, said alloy layer having a room-temperature resistivity higher by twice or more than the room-temperature resistivity of pure gold,
    wherein
    when the superconducting thin film goes into a normal conductive state by an overcurrent, the overcurrent flowing through the superconducting thin film is transferred only to the alloy layer;
    the superconducting thin film is made of a high temperature superconducting oxide YBCO thin film; and
    the alloy layer consists of gold and silver mixed by 7 to 82 wt % therewith.

2. A superconducting fault-current limiting element comprising:
    a sapphire substrate;
    a buffer layer;
    a superconducting thin film; and
    an alloy layer of silver and gold formed on the superconducting thin film, said alloy layer having a room-temperature resistivity higher by twice or more than the room-temperature resistivity of pure gold,
    said superconducting fault-current limiting element further comprising a shunt resistor made of a pure metal wire or an alloy wire, and
    said shunt resistor being connected in parallel with the superconducting thin film,
    wherein the superconducting thin film is made of a high temperature superconducting oxide YBCO thin film; and
    the alloy layer consists of gold and silver mixed by 7 to 82 wt % therewith.

3. The superconducting fault-current limiting element according to claim 2, wherein the shunt resistor is made of a noninductively wound wire to thereby give a smaller inductance.

4. A process for producing the superconducting fault-current limiting element according to claim 1 or 2, which comprises conducting a sputter deposition of the alloy layer on the superconducting thin film formed on the sapphire substrate.

5. The superconducting fault-current limiting element according to claim 1, which is produced by conducting a sputter deposition of the alloy layer on the superconducting thin film formed on the insulator substrate, wherein heat treatment after conducting the sputter deposition is not conducted.

6. The superconducting fault-current limiting element according to claim 2, which is produced by conducting a sputter deposition of the alloy layer on the superconducting thin film formed on the insulator substrate, wherein heat treatment after conducting the sputter deposition is not conducted.

7. The superconducting fault-current limiting element according to claim 1, wherein the YBCO thin film is configured with a critical current density equal to or greater than 3 $MA/cm^2$.

8. The superconducting fault-current limiting element according to claim 2, wherein the YBCO thin film is configured with a critical current density equal to or greater than 3 $MA/cm^2$.

* * * * *